United States Patent [19]

Takubo et al.

[11] Patent Number: 5,220,486

[45] Date of Patent: Jun. 15, 1993

[54] IC PACKING DEVICE

[75] Inventors: Chiaki Takubo, Yokohama; Hiroshi Tazawa; Yoshiharu Tsuboi, both of Tokyo, all of Japan

[73] Assignee: Kabushiki Kaisha Toshiba, Kawasaki, Japan

[21] Appl. No.: 757,523

[22] Filed: Sep. 11, 1991

[30] Foreign Application Priority Data

Sep. 14, 1990 [JP] Japan .................. 2-242513

[51] Int. Cl.⁵ .............................. H05K 7/20
[52] U.S. Cl. .................. 361/388; 257/666; 257/701; 257/712; 361/398; 361/401; 361/408
[58] Field of Search .............. 357/68, 69, 70, 74, 357/80, 81; 361/398, 386–388, 406, 408, 401, 421

[56] References Cited

U.S. PATENT DOCUMENTS

| | | | |
|---|---|---|---|
| 4,782,589 | 11/1988 | Dennis | 361/421 |
| 4,920,454 | 4/1990 | Stopper et al. | 361/398 |
| 4,991,001 | 2/1991 | Takubo et al. | 357/80 |

FOREIGN PATENT DOCUMENTS 2-121342 6/1990 Japan .
2-121344 9/1990 Japan .

*Primary Examiner*—Gregory D. Thompson
*Attorney, Agent, or Firm*—Oblon, Spivak, McClelland, Maier & Neustadt

[57] ABSTRACT

An IC packing device comprises a semiconductor device, a piece of flexible resin film provided with an opening for receiving the semiconductor, wires arranged on the piece of flexible resin film and slits cut into the piece of film from the edges of the opening. The slits cut into the flexible resin film allow the film to be flexed downward toward the semiconductor, along with the wires which to establish electrical connection with the semiconductor. In this manner, the downwardly bent flexible film provides reduction in the possibility of a wire breaking due to excessive bending of the wire in order to make contact with the semiconductor.

5 Claims, 5 Drawing Sheets

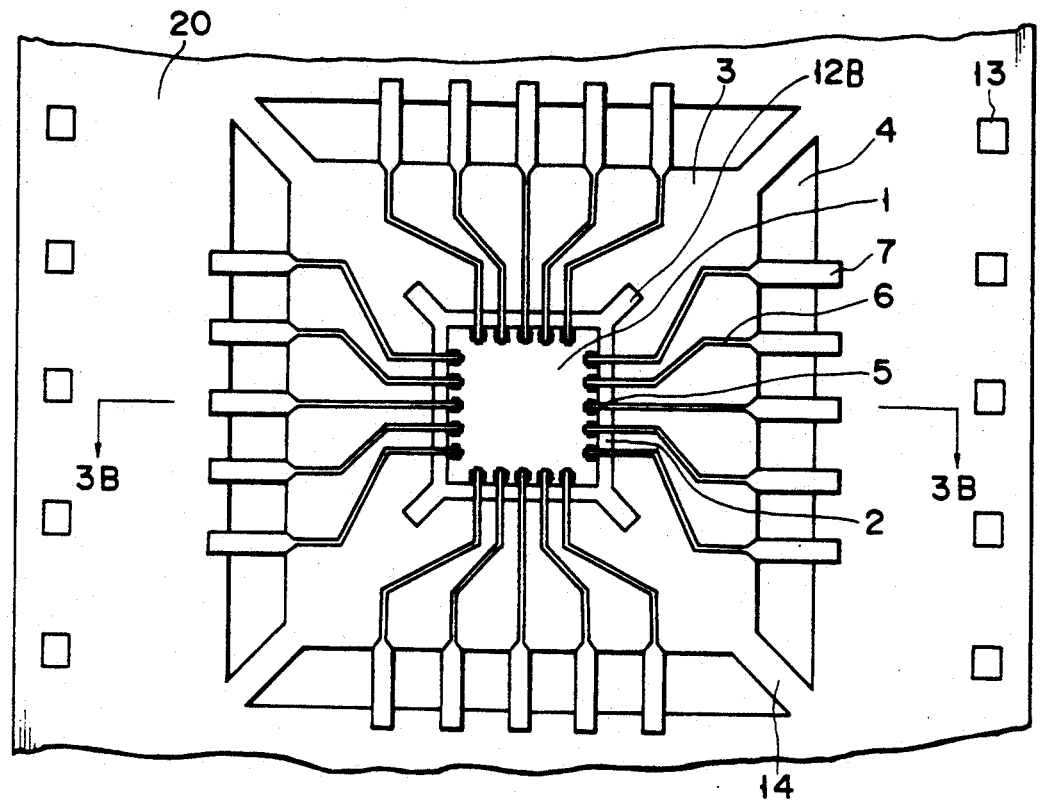
F I G. 3A
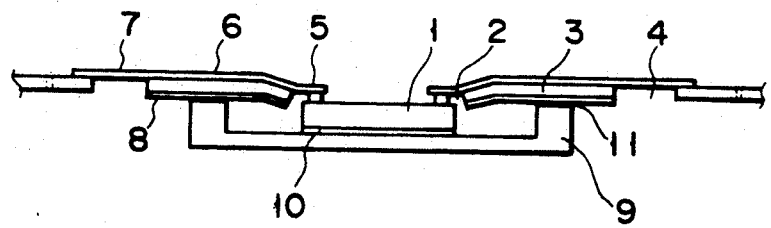
F I G. 3B

IC PACKING DEVICE

BACKGROUND OF THE INVENTION

1. Field of the Invention

This invention relates to an IC packing device for packing a semiconductor device in an IC or LSI unit by means of a film carrier.

2. Description of the Related Art

With the current progress of technology of manufacturing integrated circuits including IC and LSIs, the number of electrode pads to be arranged on a semiconductor device has been inevitably and remarkably increased in order to accommodate a large number of wires including those for power supply lines, input signal lines and other lines and, at the same time, the level of power consumption has risen considerably, and such a semiconductor device may operate at a very high speed. Wires arranged in a so-called packaged apparatus and terminals of a semiconductor device loaded in an apparatus of this type are normally connected by means of so-called bonding wires. However, as the level of integration of ICs and LSIs is raised and hence bonding pads are arranged very densely, there arise problems including the following.

1) The movement of the tool being used for a bonding operation can be blocked by nearby wires so as to obstruct the operation.

2) As there exists a bottom line for the size and pitch of arrangement of bonding pads that limits the miniaturization of bonding pads, the dimensions of a semiconductor device cannot be infinitely reduced. Consequently, there also exits a bottom line for the length of signal carrying wires to be arranged on a semiconductor device.

A technique called TAB (Tape Automated Bonding) has been proposed in an attempt to avoid these problems. With TAB, metal wires are arranged on a relatively long substrate made of flexible resin film and these wire are connected with respective matching input electrode pads of semiconductor devices mounted on the substrate by means of salient electrodes called bumps. Devices having a large number of input/output electrode pads as well as devices such as GaAs ICs that meet the requirement of high speed operation can be manufactured by using the TAB technique. Some of the known TAB-related methods and devices are disclosed in K. Furukawa et al., Japanese Patent No. 2-121342; Oct. 8, 1988), Y. Kondo et al.; Japanese Patent No. 2-121344; May 9, 1990) and C. Takubo et al.; U.S. Pat. No. 4,991,001; Feb. 5, 1991.

FIGS. 1A and 1B of the accompanying drawings show a film carrier to be used with a known TAB method and a semiconductor device mounted on the film carrier.

Referring to FIGS. 1A and 1B, a strip of resin film 20 (hereinafter referred to as "film") to be used for a film carrier has perforations 13 arranged along its lateral edges at a given pitch. Openings 2 for receiving semiconductor devices 1 are formed along the center of the film 20. Four isogonal-trapezoidal openings 4 are symmetrically arranged along the edges of a semiconductor device receiving opening 2 to surround the latter and spaced apart by a given distance from the respective corresponding edges of the opening 2. Each of the openings 4 is separated from the adjacent ones by film bridges 14, the number of which is four in total for an opening 2. Wires 6 are mainly laid on a film area 3 defined by the openings 2 and 4. Each of the wires 6 is provided with an outer lead 7 at an end that acts as a terminal for connection with an external element and an inner lead 5 at the other end.

When viewed from a side (see FIG. 1B), each of the wires 6 of a semiconductor unit having a configuration as described above is bent downward at its inner lead portion 5 at the time of manufacturing because of a low profile of the corresponding electrode pad of the semiconductor device 1. The downward bending of the inner leads 5 of a semiconductor unit is done to avoid short circuiting that can take place when one of the leads touches an edge of the semiconductor device 1 if the electrode pads of the semiconductor device 1 stand higher than the wires on the film. Therefore, the top of each electrode pad of a semiconductor device 1 is made lower than the corresponding wire 6 laid on a film. However, since the difference in height between the top of an electrode pad and a corresponding wire can vary as a function of, among other things, the thickness of the adhesive applied there and that of the semiconductor device mounted there if the bottom of the semiconductor device is grounded to reduce the overall thickness, it is quite possible that it becomes greater than an intended value. Then, any of the inner leads 5 of a semiconductor unit can be severely bent and eventually broken. The possibility of broken inner leads is particularly high when a large number of pins are used for a semiconductor device because inner leads should be arranged at a high pitch around the semiconductor device and, therefore, they should be made very narrow and thin, significantly reducing their mechanical strength. The probability of broken inner leads may be somewhat reduced if they are made relatively long. In order to prevent broken inner leads in a production process, the length of inner leads apparently has a maximum limit. Besides, longer inner leads result in an enhanced inductance and deterioration of the quality of high speed signals.

As is described above, for an LSI to achieve an enhanced level of integration, the number of pins to be used for each semiconductor device should be increased. To meet this requirement, the pitch of arrangement of inner leads of a semiconductor device needs to be reduced, requiring by the use of narrow and thin inner leads which partly lose their strength, leading to an increased probability of broken inner leads at the time of bending operation.

Additionally, as the level of integration of an LSI is enhanced, it can emit more heat, which should be effectively removed from the LSI or, more particularly, from the semiconductor device it comprises.

SUMMARY OF THE INVENTION

It is the object of the present invention to provide an IC packing device for packing a semiconductor device in an IC or LSI unit by means of a film carrier, said IC packing device having a configuration that can minimize the stress generated within and the degree of bending of the inner leads for the semiconductor device and is good for high speed signal transmission.

According to a first aspect of the invention, the above object is achieved by providing a IC packing device comprising a film carrier having an opening for receiving a semiconductor device and provided with a plurality of slits arranged along said opening in a film area for supporting inner leads in order for the film to become deformed and bent at the time of bonding the inner leads.

According to a second aspect of the invention, there is provided a IC packing device comprising a film carrier having an opening for receiving a device and provided with film sections extending from the edges of said opening toward the semiconductor device received in said opening for supporting the inner leads of wires for high speed signal transmission, while the distance between the edges of said opening and the outer periphery of the semiconductor device is kept sufficiently long to prevent the inner leads of the wires for low speed signal transmission supported on the film from being deformed, bent and broken at the time of bonding them to the semiconductor device.

An IC packing device according to the invention may preferably be provided on its underside with a heat emitting section for releasing the heat generated by the semiconductor device.

With an IC packing device according to the invention, if the inner leads of the wires connecting with the semiconductor device are located significantly above the electrode pads arranged on the semiconductor device at the time of bonding the inner leads, the film sections supporting the inner leads for high speed signal transmission can be appropriately deformed to prevent them from being severely bent and eventually broken.

According to the first aspect of the present invention, an IC packing device comprises slits cut into the resin film from the edges of the central opening for receiving a semiconductor device, the film can be appropriately deformed and bent near the edges of said opening to effectively prevent the inner leads of the wires for connecting with the semiconductor device from being excessively deformed and/or bent and eventually broken when the inner leads are bonded to respective matching pad electrodes on the semiconductor device by means of bonding metal bumps.

According to the second aspect of the present invention, the IC packing device comprises extended film sections for supporting inner leads of wires for high speed signal transmission, the characteristic impedance of said inner leads can be set to a desired value by arranging grounding wires adjacent to the respective inner leads to minimize reflection, loss and distortion of signals by said inner leads.

A metal heat emitting section arranged on the underside of an IC packing device according to the invention can effectively remove the heat generated by the semiconductor device. In addition, the impedance of the semiconductor device can be reduced by using the heat emitting section as a common grounding terminal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A shows a plan view of a film carrier of the second embodiment of the present invention and FIG. 3B shows a sectional view thereof along line 3B—3B of FIG. 3A;

DETAILED DESCRIPTION OF THE PREFERRED EMBODIMENTS

Now the present invention will be described in greater detail by way of preferred embodiments.

Embodiment 1

Figure 1A:
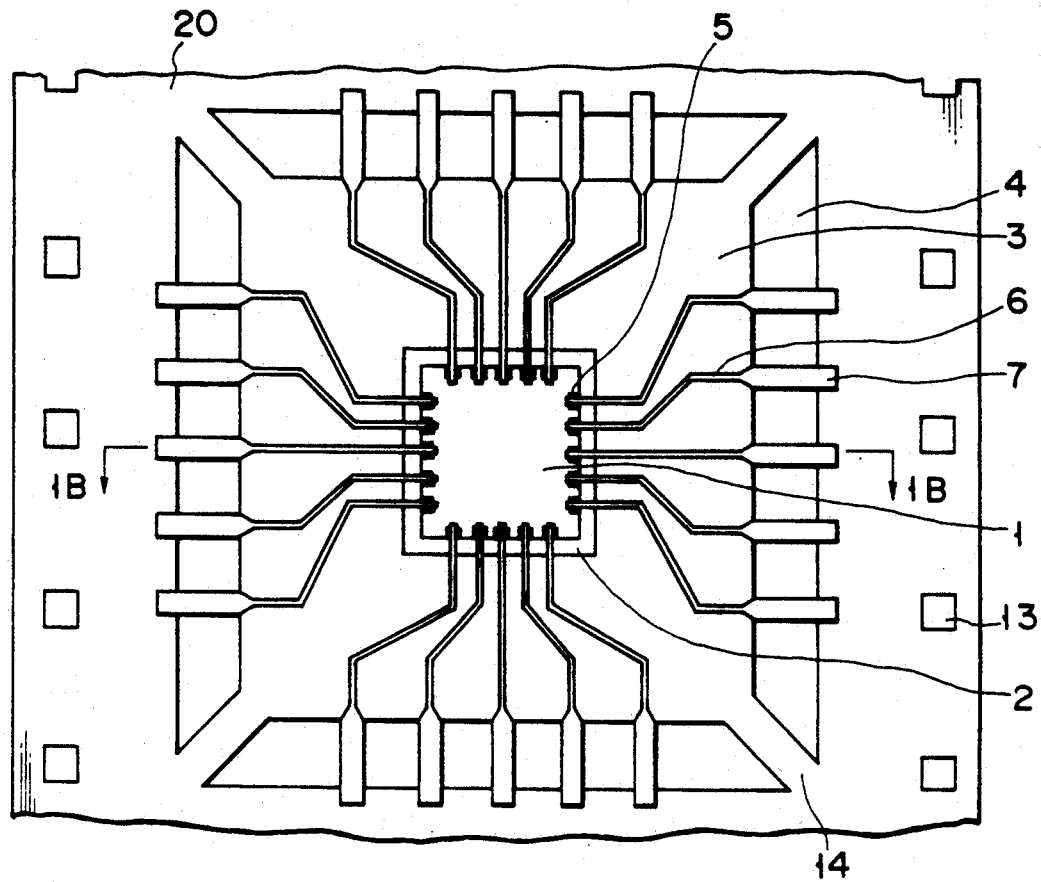
FIG. 1A shows a plan view of a conventional film carrier and FIG. 1B shows a sectional view thereof along line 1B—1B of FIG. 1A.
Figure 1B:
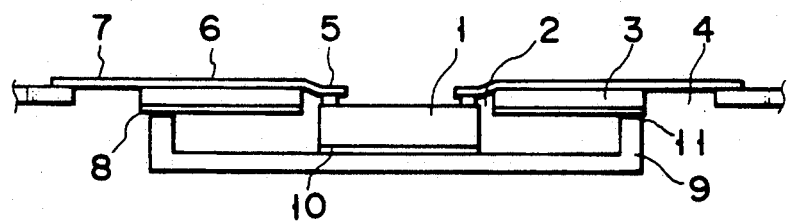
Figure 2A:
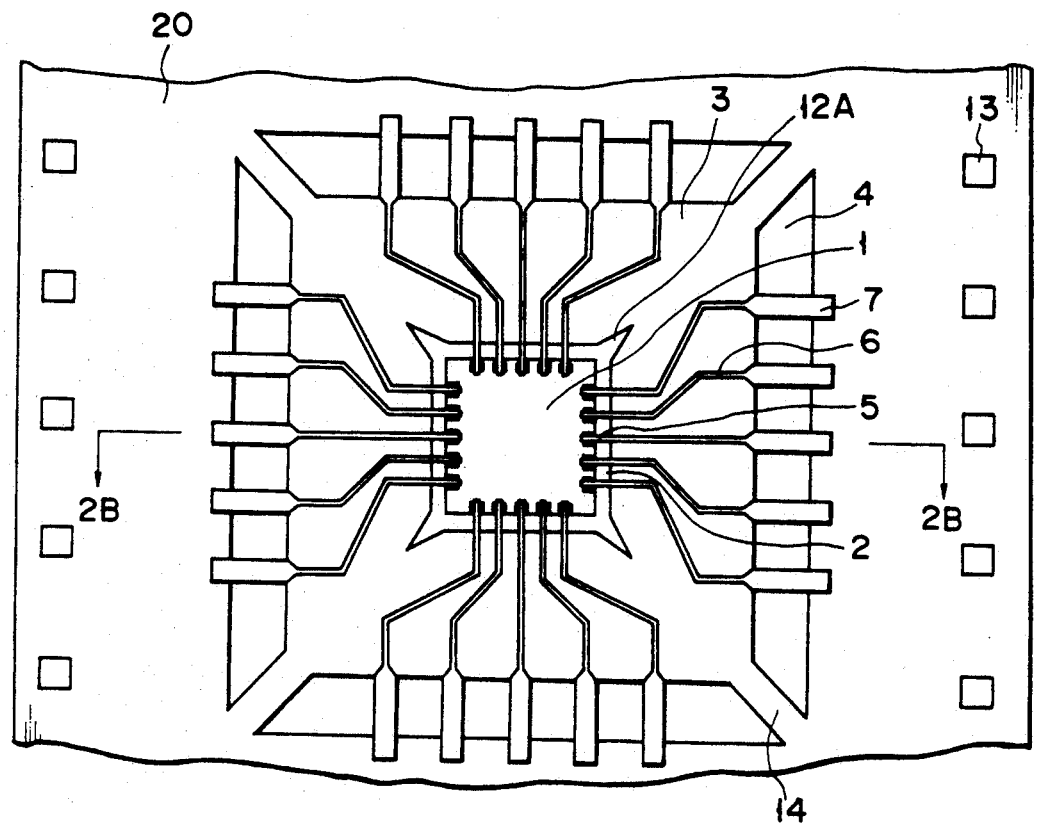
FIG. 2A shows a plan view of a film carrier of the first embodiment of the present invention and FIG. 2B shows a sectional view thereof along line 2B—2B of FIG. 2A.
Figure 2B:
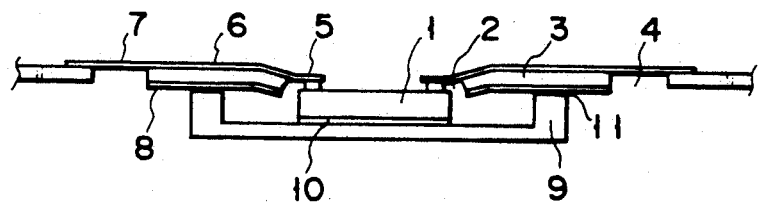

Referring to FIGS. 2A and 2B respectively showing a plan view of a film carrier of a first embodiment of the invention and a sectional view thereof along line 2B—2B of FIG. 2A, a film carrier 20 is a strip of flexible film (hereinafter referred to as "film") which is made of polyimide resin, polyester or another insulating plastic material. The film 20 has a pair of rows of perforations 13 arranged at a pregiven pitch along the lateral edges for feeding the film to a machine that processes it. Square openings for receiving semiconductor devices are formed through the film 1 along its center line. Four isogonal-trapezoidal openings 4 are arranged along the four edges of each semiconductor device receiving opening 2 to surround the latter with a pregiven distance provided between the latter and each of the openings 4. Each of the openings 4 are separated from the adjacent ones by bridge sections 14 of the film 1. The bridge sections 14 support a film area 3 defined by the central opening 2 and the surrounding openings 4. Wires 6, typically prepared from a photoetched copper foil, are connected to respective electrode pads (not shown) of a semiconductor device by way of respective bump electrodes (not shown) of a device such as a GaAs semiconductor device received in the central opening 2 and surrounded by the film area 3. The copper foil is plated by nickel and tin or nickel and gold. The film 20 has a thickness of 25 to 125 $\mu$m, while the wires 6 have a thickness of 15 to 35 $\mu$m. Since the wires 6 are formed on the film 20 by means of a photoetching technique, they can be arranged at a high pitch with a high degree of precision as compared with the leads of a semiconductor device realized in the form of a ceramic package. Each of the wires 6 is provided with an outer lead 7 to be used for connection with an external element and an inner lead 5. The portion of the wire between the outer lead 7 and the inner lead may be called an intermediate lead and is supported by the film area 3. The inner lead 5 is connected to the semiconductor device 1 by way of an electrode pad and a bump electrode (not shown). Therefore, the front end of the inner lead 5 reaches the central opening 2 for receiving a semiconductor device. The outer leads 7 of the wires 6, on the other hand, are arranged on openings 4 surrounding the central opening 2. Therefore the openings 4 may be called outer lead receiving openings. As the electrode pads of a semiconductor device are regularly arranged along the outer periphery of the semiconductor device, the corresponding wires 6 normally produce a uniform pattern that extends to the outer lead receiving openings. Consequently, the four bridge sections 14 arranged on the diagonal lines of a square defined by the outer lead receiving openings and separating the four groups of leads received by the respective outer lead receiving openings normally provide relatively large vacant areas where no leads are found. However, it should be noted that the wires do not necessarily present a uniform pattern as illustrated in FIG. 2A for various reasons. For instance, as often observed in bipolar ICs, the pattern of wires can be deformed depending on the arrangement of electrode pads if the latter are irregularly arranged on the semiconductor device. If the pattern of wires is deformed, the bridge sections 14 are not necessarily found on the diagonals of the square defined by four outer lead receiving openings. Now, the underside of a semiconductor device 1 is bonded to a heat emitting substrate 9 by means of adhesive 10 and connected to a wired surface area 8 arranged on the underside of the film by means of adhesive 11. A die bonding agent principally containing polyimide is normally used for the layers of adhesive 10 and 11. The heat emitting substrate 9 is made of an aluminum or copper alloy and has a recess for receiving a semiconductor device 1. The recess has a shape corresponding to that of the semiconductor device it receives and a depth of 500 μm which is approximately equal to the height of the semiconductor device. The film area 3 is a square, each of its edges being approximately 7 mm long, and an opening is formed at the center of the film area 3 to receive a semiconductor 1 which is also square with edges, each of which is 2 mm long.

A semiconductor unit having a configuration as described above will be assembled in the following manner. Firstly, a semiconductor device 1 is rigidly fitted to a heat emitting substrate 9 by means of adhesive 10. Then, the heat emitting substrate 9 and a metal-wired surface area 8 arranged on the underside of a film 20 are bonded together by means of adhesive 11, maintaining the alignment of the electrode pads of the semiconductor 1, to which the heat emitting substrate 9 is securely fitted, and the respective matching inner leads of the wires on the film 20. Finally, the pads of the semiconductor device 1 and the respective matching inner leads 5 are bonded together by mean of bonding metal bumps.

In this embodiment, four slits 12A are cut into the film 20 from the four corner of the opening 2 for receiving a semiconductor device 1 with a view to hold the leads arranged at the four corners. The slits of this embodiment are substantially triangular in shape. The opening 2 of the film 20 may be punched out by means of a metal puncher along with the openings 4 which are punched out by another puncher. Alternatively, it may be formed by using an etching technique. While each of the triangular slots 12A of this embodiment has a 10 μm short edge and a pair of 500 μm long edges, the dimensions of the slits are not necessarily limited to these values and may be appropriately determined depending on the size and thickness of the film, the size of the semiconductor device and other factors. Moreover, while the slits are advantageously made into identical triangles, they may alternatively take any other forms including quadrangles and other polygons as well as forms involving curves depending on the size and thickness of the film, the number and pitch of inner leads arranged along the edges of the central opening 2.

The underside of a semiconductor device 1 is rigidly fitted to a heat emitting substrate 9 by means of adhesive 10. The heat emitting substrate 9 is, in turn, connected to a metal-wired surface area 8 arranged on the underside of a film 20 by means of adhesive 11. The layers of adhesive 10 and 11 are made of a die bonding have a thickness of approximately 10 to 30 μm. A heat emitting substrate 9 is made of a copper alloy and has an approximately 500 μm deep recess for receiving a semiconductor device 1 having a thickness which is equal to the depth of the recess. With such an arrangement, the lower surface of the inner leads and the upper surface of the metal bumps (not shown) which are made of gold or solder and formed on the electrode pads of the semiconductor device 1 will show a gap of approximately 100 to 150 μm, when the inner leads are bonded to the respective matching electrode pads by means of a thermocompression bonding technique. At the time of the thermo-compression bonding operation, the film is deformed to a certain extent as shown in FIG. 2B to prevent the inner leads 5 from being excessively deformed and eventually broken.

Embodiment 2

Referring to FIGS. 3A and 3B illustrating a second embodiment of the invention, this embodiment differs from the first embodiment in that the slits 12A cut into a film 20 from the four corners of a square central opening 2 for receiving a semiconductor device 1 are rectangular. Each of the shorter edges of a rectangular slit 12A is about 100 μm long while each of the longer edges is about 500 μm long. However, as described earlier by referring to the first embodiment, the dimensions of the slits 12A may vary depending on the size and thickness of the film, the thickness of the semiconductor device to be carried by the film, the pitch at which the inner leads are arranged along the four edges of the opening for receiving a semiconductor device and other factors. Besides, the slits may be different from one another in terms of size and shape.

Embodiment 3

Figure 4A:
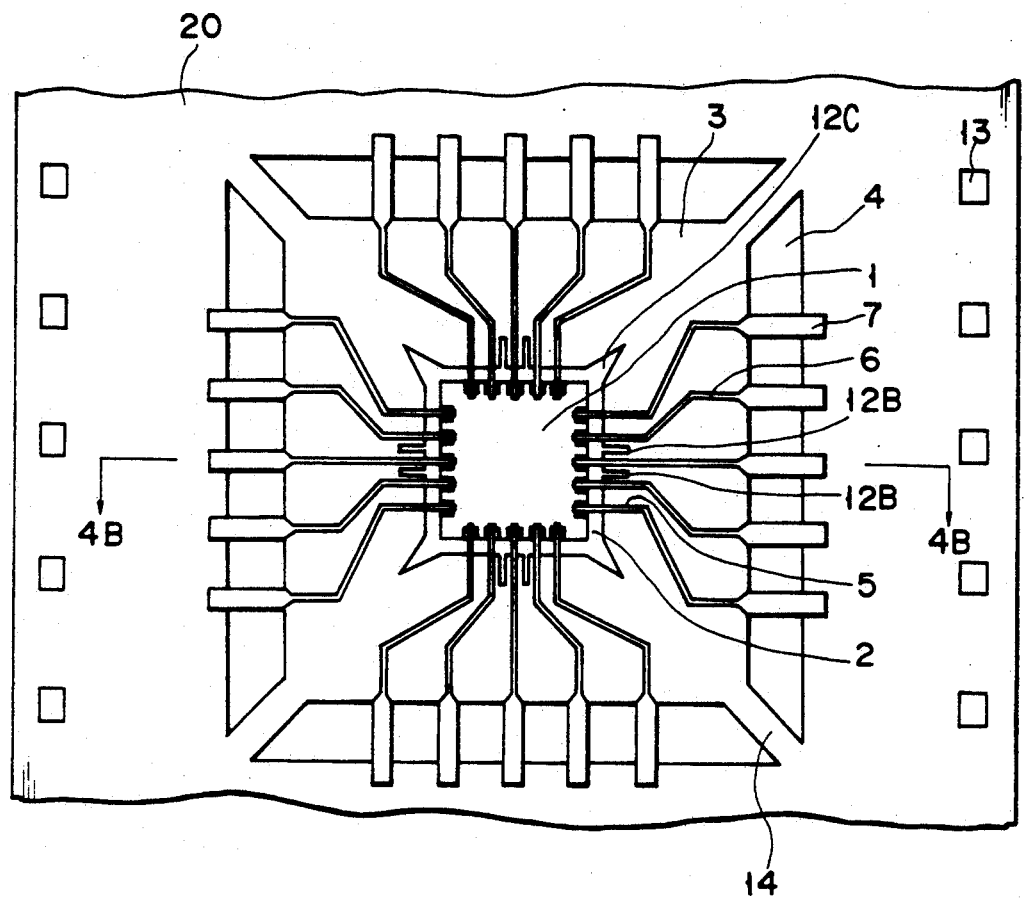
FIG. 4A shows a plan view of a film carrier of the third embodiment of the present invention and FIG. 4B shows a sectional view thereof along line 4B—4B of FIG. 4A.
Figure 4B:
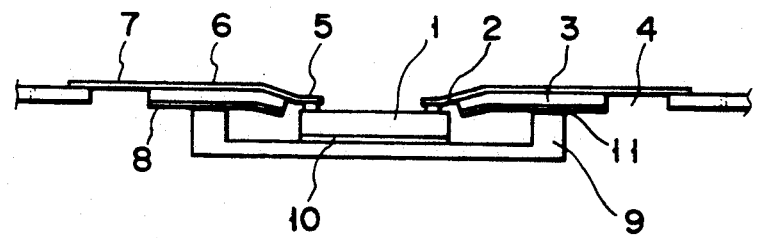

Referring to FIGS. 4A and 4B illustrating a third embodiment of the invention, this embodiment differs from the first and second embodiments in that, besides the four slits arranged at the four corners of the central opening of a film, it also comprises slits 12B cut into the film from the four sides of the central opening 2 in a film area for supporting inner leads. The slits at the four corners of the opening 2 are similar to those of Embodiment 1 or 2, whereas the slits 12B arranged along the four sides of the central opening 2 in the film area for supporting inner leads are rectangular. Each of the shorter edges of the slits 12B is approximately 100 μm long and each of the longer edges of the slits 12B is about 500 μm long, although the dimensions of the slits 12B may vary depending on the size and thickness of the film, the thickness of the semiconductor device to be carried by the film, the pitch at which the inner leads are arranged along the four edges of the opening for receiving a semiconductor device and other factors and the slits may be different from one another in terms of size and shape as described earlier by referring to Embodiments 1 and 2. Moreover, wires 6 and inner leads may be arranged only on the areas of the film where the slits 12B are not formed in order to form such slits 12B with ease.

Embodiment 4

Now a fourth embodiment will be described by referring to FIGS. 5A, 5B, and 5C.

Figure 5A:
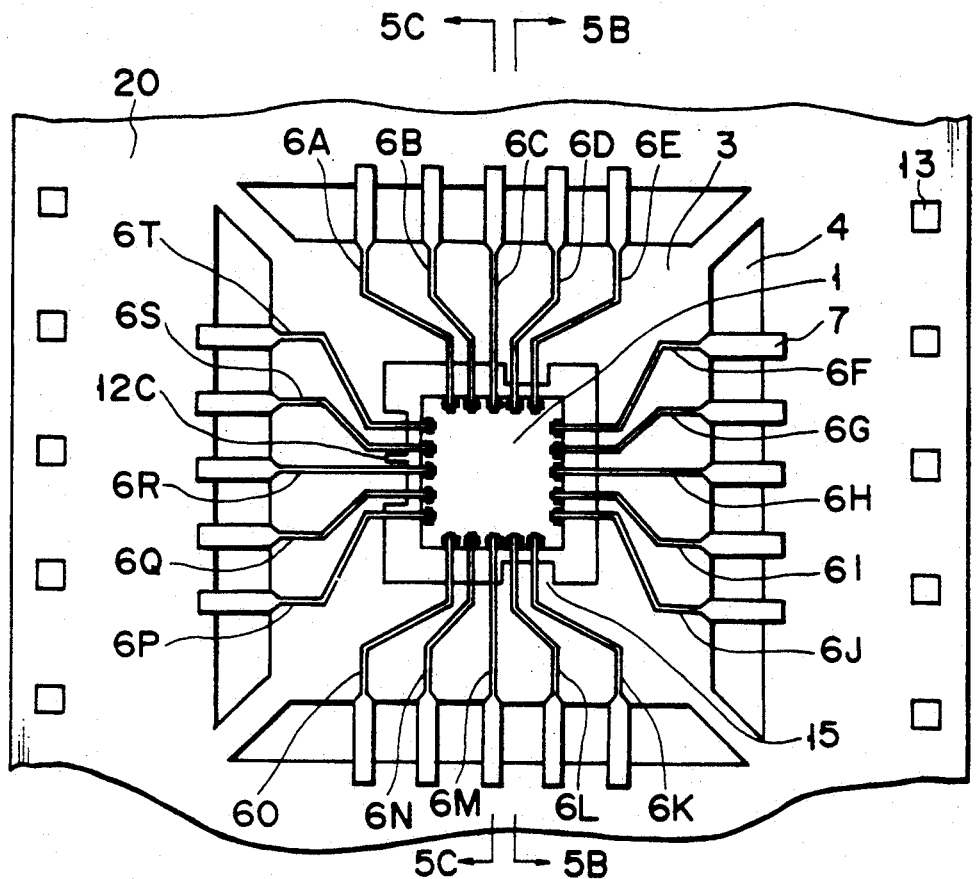
FIG. 5A shows a plan view of a film carrier to be used for the fourth embodiment.
Figure 5B:
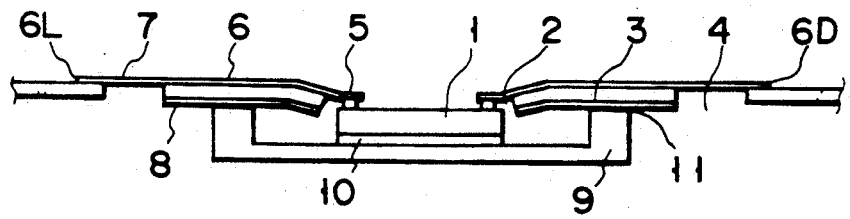
FIG. 5B shows a sectional view of the film carrier cut along line 5B—5B of FIG. 5A.
Figure 5C:
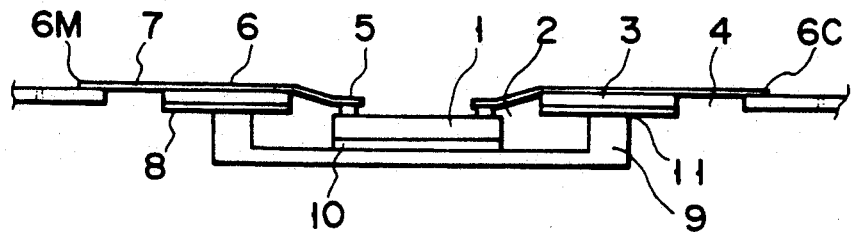
FIG. 5C shows a sectional view of the film carrier cut along line 5C—5C of FIG. 5A.

FIG. 5A is a plan view of a film carrier to be used for the fourth embodiment and FIG. 5B is a sectional view of the film carrier cut along line 5B—5B of FIG. 5A, while FIG. 5C is a sectional view of the film carrier cut along line 5C—5C of FIG. 5A.

In this embodiment, wires 6A through 6T are arranged in a film area 3. Of these wires, the wires 6D, 6E, 6K, 6L, 6Q, 6R, 6S and 6T are used for high speed signal transmission. The remaining wires are used for low speed signal transmission, power supply and grounding.

The film area 3 has extended sections 15 under the inner leads of the wires for high speed signal transmission. Ground conductors are arranged on or near the undersides of the extended sections 15 and the characteristic impedance is set to a predetermined value. In FIG. 5B, the inner leads of the wires 6D and 6L for high speed signal transmission are connected to a semiconductor device such as a GaAs semiconductor device. The film area 3 is extended toward the semiconductor device under the junctions of the inner leads of the wires 6D and 6L and the semiconductor device, whereas it is not under their counterparts for the inner leads of the wires 6M and 6N for low speed signal transmission, grounding and power supply. With such an arrangement, the wires 6D and 6L are particularly free from excessive stress and hence breakage as the extended sections 15 of the film area 3 can be deformed to release the stress applied to the wires when they are bonded to the semiconductor device even if their inner leads are relatively short.

FIG. 5C shows some of the wires for low speed signal transmission, power supply and grounding connected to the semiconductor device which is typically a GaAs semiconductor device. It may be seen in FIG. 5C that the inner leads for the wires 6C and 6M connected to the semiconductor device are relatively long so that they may be easily deformed to release excessive stress given to them to avoid breakage when they are bonded to the semiconductor device.

The film area 3 is extended toward the semiconductor device under the wires 6Q through 6T for high speed signal transmission as in the case of the wires 6D and 6L. Besides, the film area is provided with slits 12C. The slits 12C may be longer than, shorter than or equal to the length of the extended sections 15 of the film area 3 so long as they can effectively release the stress applied to the wires and the film.

It is needless to say that the present invention is not limited to the above described embodiments and various modifications may be made thereto without departing from the spirit and scope of the present invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An IC packing device comprising;
   a semiconductor device;
   a flexible resin film piece obtained by cutting a flexible resin film strip provided with a plurality of perforations arranged at a predetermined pitch,
   said flexible resin film piece being provided with a square opening having a plurality of diagonals in which said semiconductor device is received, and at least one slit which is cut into said flexible resin film piece from an edge of said square opening along at least one of the diagonals of said square opening and is formed as a part of said square opening; and
   wires arranged on said flexible resin film piece and electrically connected to said semiconductor device,
   wherein said wires are disposed in a plane above a top surface of said semiconductor, and wherein said at least one slit which is cut into said flexible resin film piece reduces a possibility of breakage of said wires by reducing an amount of bending required by said wires in realizing electrical connection between said wires and said semiconductor device.

2. An IC packing device according to claim 1, wherein said flexible resin film piece is further provided with at least one additional slit which is selectively cut into said flexible resin film piece from an edge of said square opening along and between two adjacent wires and is formed as a part of said square opening.

3. An IC packing device according to claim 1, further comprising heat emitting means in contact with a first surface of said flexible resin film piece opposite to a second surface of said flexible resin film piece on which said wires are arranged.

4. An IC packing device comprising;
   a semiconductor device;
   a flexible resin film piece obtained by cutting a flexible resin film strip provided with a plurality of perforations arranged at a predetermined pitch,
   said flexible resin film piece being provided with a square opening having a plurality of diagonals in which said semiconductor device is received and at least one slit which is selectively cut into said flexible resin film piece from any edge of said square opening except a corner region thereof and is formed as a part of said square opening; and
   wires arranged on said flexible resin film piece and connected to said semiconductor device,
   wherein said wires are disposed in a plane above a top surface of said semiconductor, and wherein said at least one slit which is cut into said flexible resin film piece reduces a possibility of breakage of said wires by reducing an amount of bending required by said wires in realizing electrical connection between said wires and said semiconductor device.

5. An IC packing device according to claim 4, further comprising heat emitting means in contact with a first surface of said flexible resin film piece opposite to a second surface of said flexible resin film piece on which said wires are arranged.

* * * * *